United States Patent [19]
Chu et al.

[11] Patent Number: 6,140,197
[45] Date of Patent: Oct. 31, 2000

[54] METHOD OF MAKING SPIRAL-TYPE RF INDUCTORS HAVING A HIGH QUALITY FACTOR (Q)

[75] Inventors: Shau-Fu Sanford Chu; Kok Wai Johnny Chew; Chee Tee Chua; Cher Liang Cha, all of Singapore, Singapore

[73] Assignees: Chartered Semiconductor Manufacturing Ltd.; National University of Singapore, both of Singapore, Singapore

[21] Appl. No.: 09/385,525

[22] Filed: Aug. 30, 1999

[51] Int. Cl.[7] ................................................ H01L 21/20
[52] U.S. Cl. ........................ 438/381; 438/421; 257/531
[58] Field of Search ................................... 438/381, 421; 257/531

[56] References Cited

U.S. PATENT DOCUMENTS

| | | | |
|---|---|---|---|
| 5,396,101 | 3/1995 | Shiga | 257/531 |
| 5,407,860 | 4/1995 | Stoltz et al. | 438/619 |
| 5,450,263 | 9/1995 | Desaigoudar et al. | 360/110 |
| 5,539,241 | 7/1996 | Abidi et al. | 257/531 |
| 5,559,055 | 9/1996 | Chang et al. | 438/586 |
| 5,792,706 | 8/1998 | Michael et al. | 438/626 |
| 5,844,299 | 12/1998 | Merrill et al. | 257/531 |
| 5,891,799 | 4/1999 | Tsui | 438/624 |

OTHER PUBLICATIONS

Yong–Jun Kim and Mark G. Allen, "Surface Micromachined Solenoid Inductors for High Frequency Applications", IEEE Transactions on Components, Packaging, and Manufacturing Technology—Part C, vol. 21, No. 1, Jan. 1998.

Seung Won Paek and Kwang Seok Seo, "Air–Gap Stacked Spiral Inductor", IEEE Microwave and Guided Wave Letters, vol. 7, No. 10, Oct. 1997.

Chuang et al., "Low Loss Air–Gap Spiral Inductors for MMICs Using Glass Microbump Bonding Technique", IEEE MTT–S Digest, 1988.

*Primary Examiner*—Chandra Chaudhari
*Assistant Examiner*—Evan Pert
*Attorney, Agent, or Firm*—George O. Saile; Rosemary L. S. Pike

[57] ABSTRACT

A new method of fabricating an inductor utilizing air as an underlying barrier in the manufacture of integrated circuits is described. A metal line is provided overlying a dielectric layer on a semiconductor substrate. An intermetal dielectric layer is deposited overlying the metal line and the dielectric layer. The intermetal dielectric layer is patterned whereby a plurality of openings are made through the intermetal dielectric layer to the semiconductor substrate. Thereafter, an oxide layer is deposited overlying the intermetal dielectric layer and capping the plurality of openings thereby forming air gaps within the intermetal dielectric layer. A metal plug is formed through the oxide layer and the intermetal dielectric layer to the metal line. A metal layer is deposited overlying the oxide layer and patterned to form an inductor wherein a portion of the inductor contacts the metal line through the metal plug to complete formation of an inductor utilizing air as an underlying barrier in the fabrication of an integrated circuit.

19 Claims, 4 Drawing Sheets

METHOD OF MAKING SPIRAL-TYPE RF INDUCTORS HAVING A HIGH QUALITY FACTOR (Q)

BACKGROUND OF THE INVENTION (1) Field of the Invention

The invention relates to a method of forming an inductor in the fabrication of integrated circuits, and more particularly, to a method of forming a high quality inductor using air as a barrier in the manufacture of integrated circuits.

(2) Description of the Prior Art

The integration of radio frequency (RF) integrated circuits on silicon is one of the greatest challenges for the growing markets of wireless communications. The incorporation of RF inductors on silicon without sacrificing the quality factor (Q) due to substrate losses has been researched heavily in recent years. Some of the techniques include: (i) selectively etching out silicon under the inductor by micro-machining, (ii) employing multi-metal layers of aluminum interconnects or copper damascene interconnects, (iii) using a high resistivity silicon substrate, (iv) employing biased wells underneath a spiral inductor, (v) inserting various types of patterned ground shield between the spiral inductor and the silicon substrate, and (vi) increasing the thickness of the interlayer dielectric. This is not an exhaustive listing. The common objectives of all of these techniques are: 1) to enhance the Q value of the inductor and 2) to increase the self-resonance frequency so that the usable frequency range of the inductor is widened.

The self-resonance caused by the parasitic capacitance of the spiral inductor from the input port to the output port, as well as to the silicon substrate will limit the use of these inductors at high frequencies. The increasing series spreading resistance will degrade the Q factor. This impacts the usefulness of integrated spiral inductors implemented on silicon substrates. These problems can be overcome if the area under the inductor is made to appear locally insulating by selectively removing the underlying silicon resulting in inductors "hanging" in air. Air, which has the lowest dielectric constant, is the most ideal barrier. However, micro-machining, used to etch away the silicon under the inductor, is complex and is not compatible with any normal process flow. It is desired to utilize air as a barrier in a process that is implemented easily and is compatible with any process flow with minimal changes.

U.S. Pat. 5,792,706 to Michael et al teaches a method of etching air gaps in an intermetal dielectric layer, forming a capping oxide over the air gaps, and forming a metal layer over the capping oxide. This method forms insulation between adjacent metal lines in a single level. U.S. Pat. 5,539,241 to Abidi et al shows a method of etching out a pit under an inductor during CMOS processing. U.S. Pat. 5,559,055 to Chang et al teaches a method of etching away a dielectric layer between metal lines, then partially filling in the spaces leaving air voids between the metal lines. U.S. Pat. 5,407,860 to Stoltz et al shows a process of forming air gaps between leads when depositing a layer, such as spin-on-glass. U.S. Pat. 5,844,299 to Merrill et al shows an inductor formed over a pit containing silicon oxide. U.S. Pat. 5,396,101 to Shiga describes an inductor. U.S. Pat. 5,450,263 to Desaigoudar et al teaches an inductor process.

SUMMARY OF THE INVENTION

A principal objective of the present invention is to provide an effective and very manufacturable method of forming a high quality inductor in the fabrication of devices for integrated circuits.

Another objective of the invention is to provide a method of fabricating an inductor utilizing air as an underlying barrier in the manufacture of integrated circuits.

In accordance with the objectives of this invention a new method of fabricating an inductor utilizing air as an underlying barrier in the manufacture of integrated circuits is achieved. A metal line is provided overlying a dielectric layer on a semiconductor substrate. An intermetal dielectric layer is deposited overlying the metal line and the dielectric layer. The intermetal dielectric layer is patterned whereby a plurality of openings are made through the intermetal dielectric layer to the underlying dielectric layer. Thereafter, an oxide layer is deposited overlying the intermetal dielectric layer and capping the plurality of openings thereby forming air gaps within the intermetal dielectric layer. A metal plug is formed through the oxide layer and the intermetal dielectric layer to the metal line. A second metal layer is deposited overlying the oxide layer and patterned to form an inductor wherein a portion of the inductor contacts the first metal line through the metal plug to complete formation of an inductor utilizing air as an underlying barrier in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention forms air gaps underlying an inductor. It is expected that the presence of the air gaps will reduce substantially the parasitic capacitance and series resistance.

Figure 1:
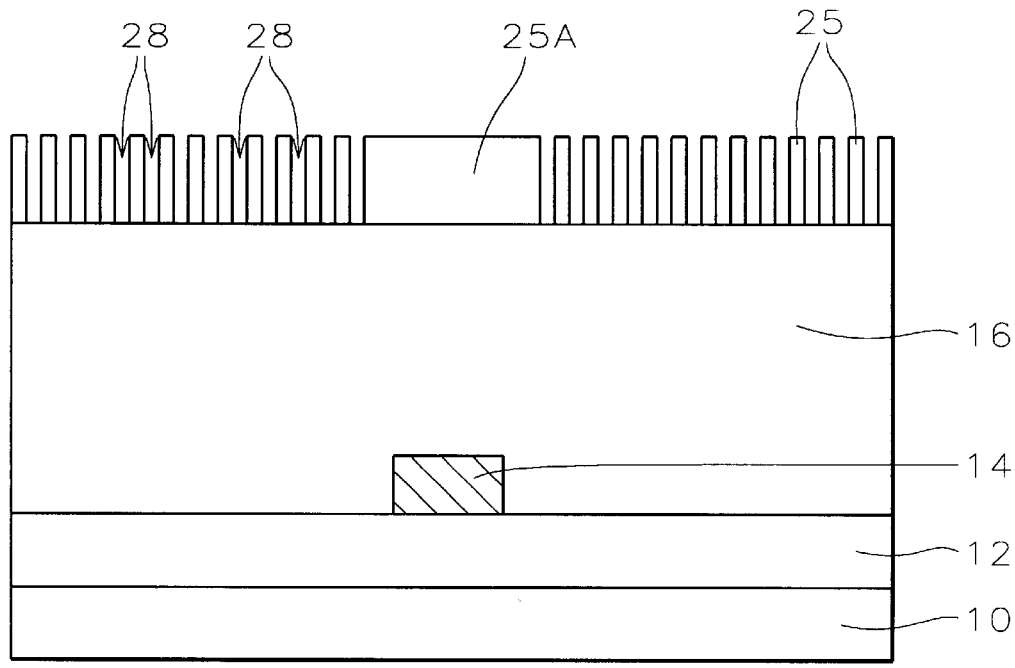
FIGS. 1 through 5 and 7 schematically illustrate, in cross-sectional representation, a preferred embodiment of the present invention.

Referring now to FIG. 1, there is shown a portion of a semiconductor substrate 10, preferably composed of monocrystalline silicon. Semiconductor device structures, including gate electrodes and associated source and drain regions and levels of metallization may be formed in and on the semiconductor substrate. An intermetal dielectric layer overlies these structures. All of these device structures, not shown, are included in the layer labeled 12. A metal line 14 that will form the node of the planned inductor is patterned and formed over the layer 12. The metal line preferably comprises aluminum-copper having a thickness of about 5000 Angstroms, having an underlying barrier layer of titanium nitride layer (about 600 Angstroms) and an overlying barrier and anti-reflective coating layer of titanium nitride (350 Angstroms).

An intermetal dielectric layer 16 is deposited over the layer 12 and the metal line 14. For example, the intermetal dielectric layer (IMD) may comprise tetraethoxysilane (TEOS) oxide and may be deposited to a thickness of between about 16,500 and 19,500 Angstroms. The TEOS layer 16 is polished, for example by chemical mechanical polishing (CMP). A layer of photoresist is coated over the surface of the IMD layer 16. A photoresist mask 25 is patterned with a plurality of holes over the surface of the IMD layer except for the area of a planned via region 25A overlying the metal line 14.

Figure 2:
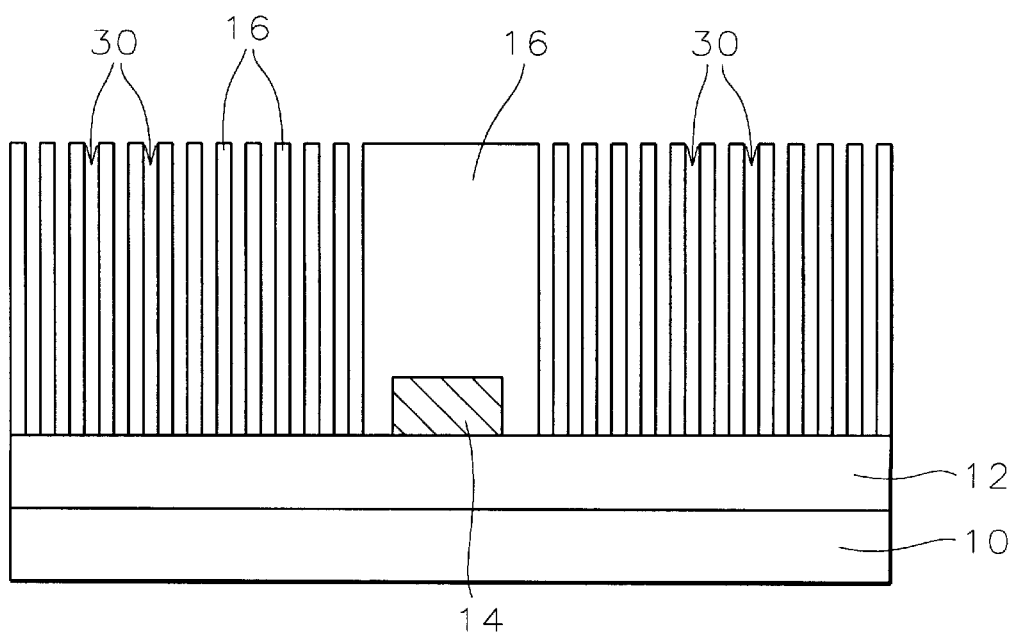

Referring now to FIG. 2, the IMD layer 16 is etched through to the underlying layer 12, that is to the topmost intermetal dielectric layer within layer 12, not shown, where it is not covered by the photoresist mask 25. Openings 30 have been made in the IMD layer 16. Openings 30 each have a typical width of about 0.4 microns, and preferably 0.40 to 0.52 microns. For a depth of 8000 Angstroms, the aspect ratio of the openings is about 2. Thicker IMD layers will have openings of higher aspect ratio. The photoresist mask 25 is stripped and the IMD surface cleaned.

Figure 3:
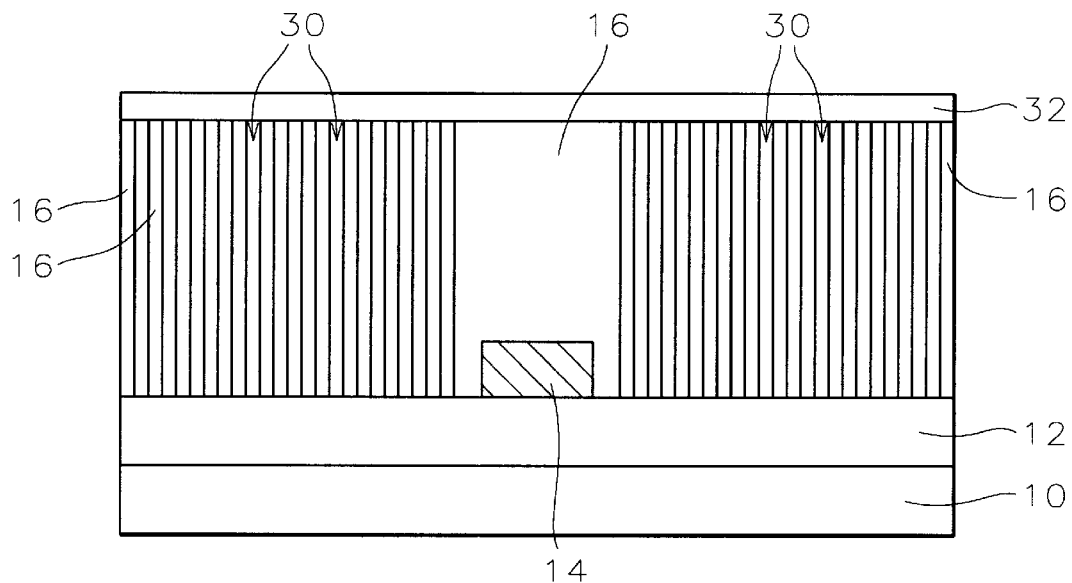

A thin oxide layer 32 is deposited over the patterned IMD layer 16, as shown in FIG. 3. This thin oxide layer is deposited by plasma enhanced chemical vapor deposition (PECVD) to a thickness of between about 1000 and 1500 Angstroms. The layer 32 provides a cap over the openings 30. The openings are sealed by the capping layer to form air gaps 30.

Figure 4:
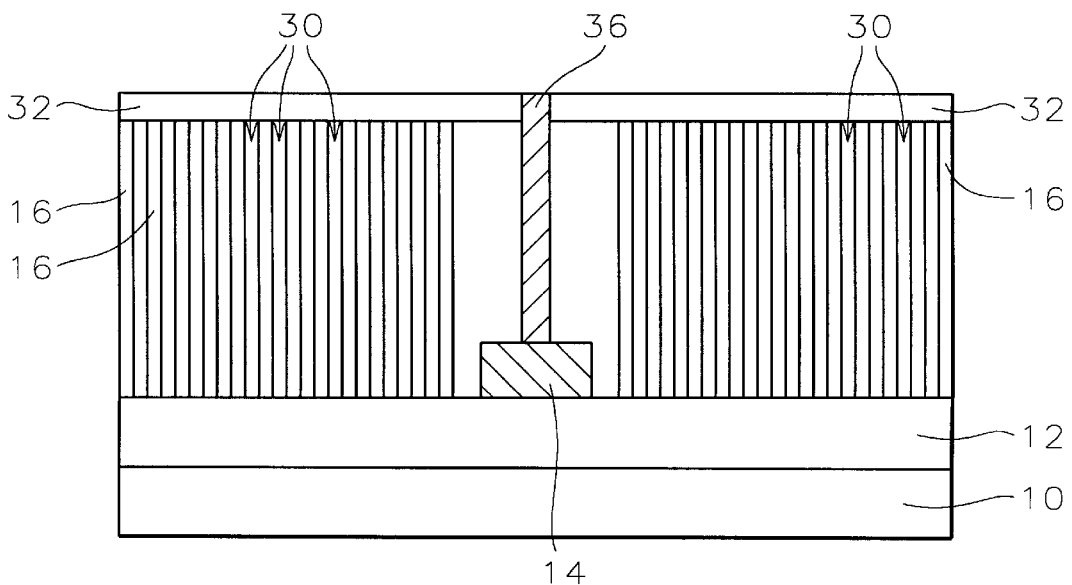

Now, referring to FIG. 4, a via opening is lithographically defined and etched through to the metal line 14. The via opening is filled with metal, such as tungsten plug 36.

Figure 5:
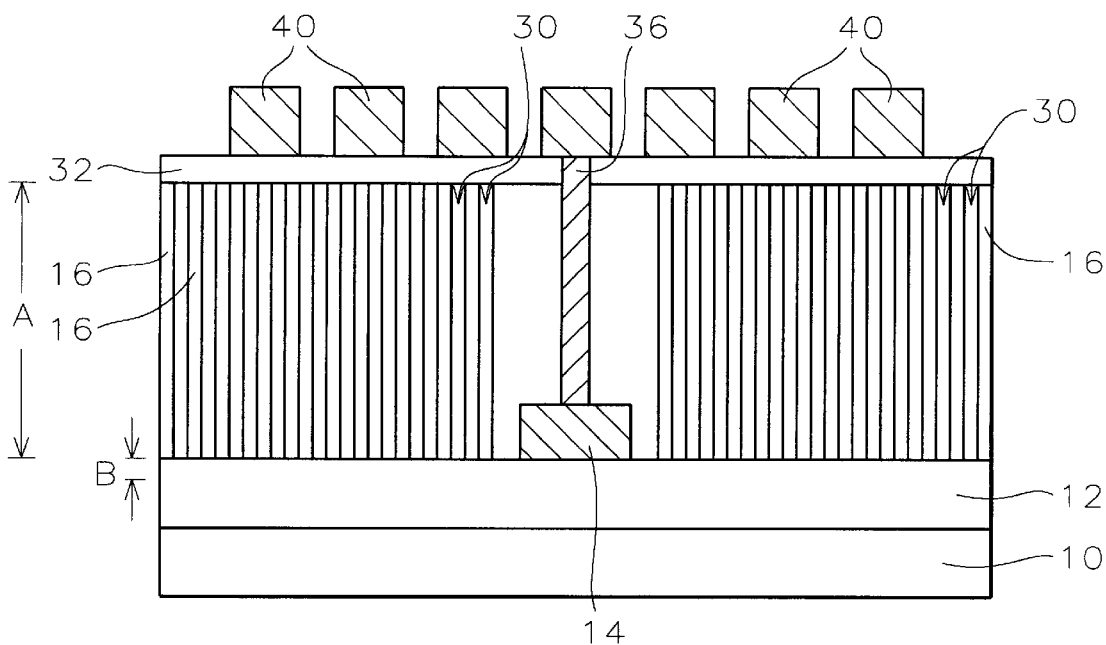

Now, as shown in FIG. 5, a layer of metal is deposited and patterned to form the inductor 40. The metal may be aluminum copper and may include a underlying and overlying barrier of titanium nitride. The metal stack may have a thickness of between about 8100 and 9900 Angstroms. The inductor 40 preferably has a spiral shape. A connection is made between one of the inductor coils and the metal line 14 through the tungsten plug 36.

The process of the present invention provides a method for forming air gaps underlying an inductor. This process does not involve micro-machining and is simple and compatible with existing processes.

Figure 6:
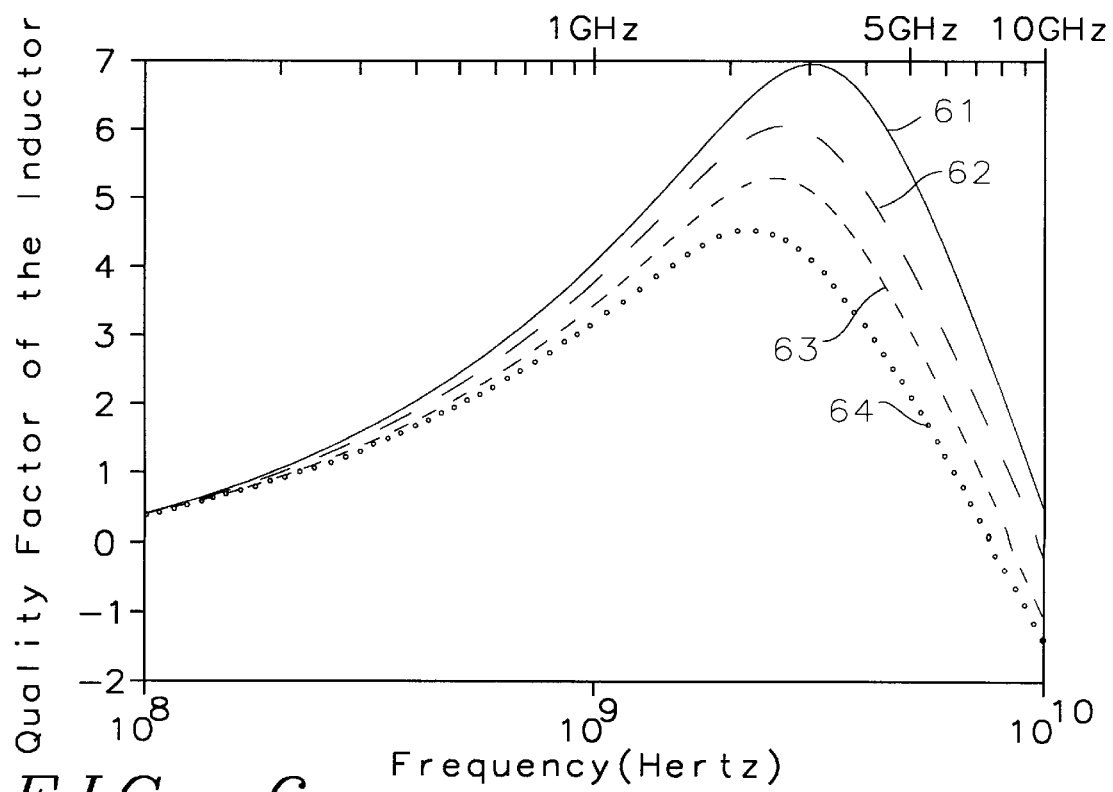
FIG. 6 graphically represents a simulation of an inductor having air gaps thereunder according to the process of the invention in comparison with an inductor without air gaps thereunder.

FIG. 6 graphically shows the quality factor of the inductor at increasing frequencies for a simulation of the inductor having thereunder the air gaps of the present invention. Line 61 illustrates the condition in which the thickness A of the air gap layer, shown in FIG. 5, is 4.5 microns and the thickness B is 0. Line 62 illustrates the condition in which the thickness A of the air gap layer is 2.6 microns and the thickness B of the oxide layer underlying the node 14 is 1.9 microns. In line 63, the air gap thickness A is 1.3 microns and the underlying oxide thickness B is 3.2 microns. In line 64, oxide thickness A without air gaps is 1.3 microns and underlying oxide thickness B is 3.2 microns. It can be seen from the graph that the quality factor increases for frequencies greater than 1 GHz for all of the simulations containing air gaps (61–63) over the simulation without air gaps (64). The highest quality factor results from the greatest depth of air gaps, as shown by 61.

Figure 7:
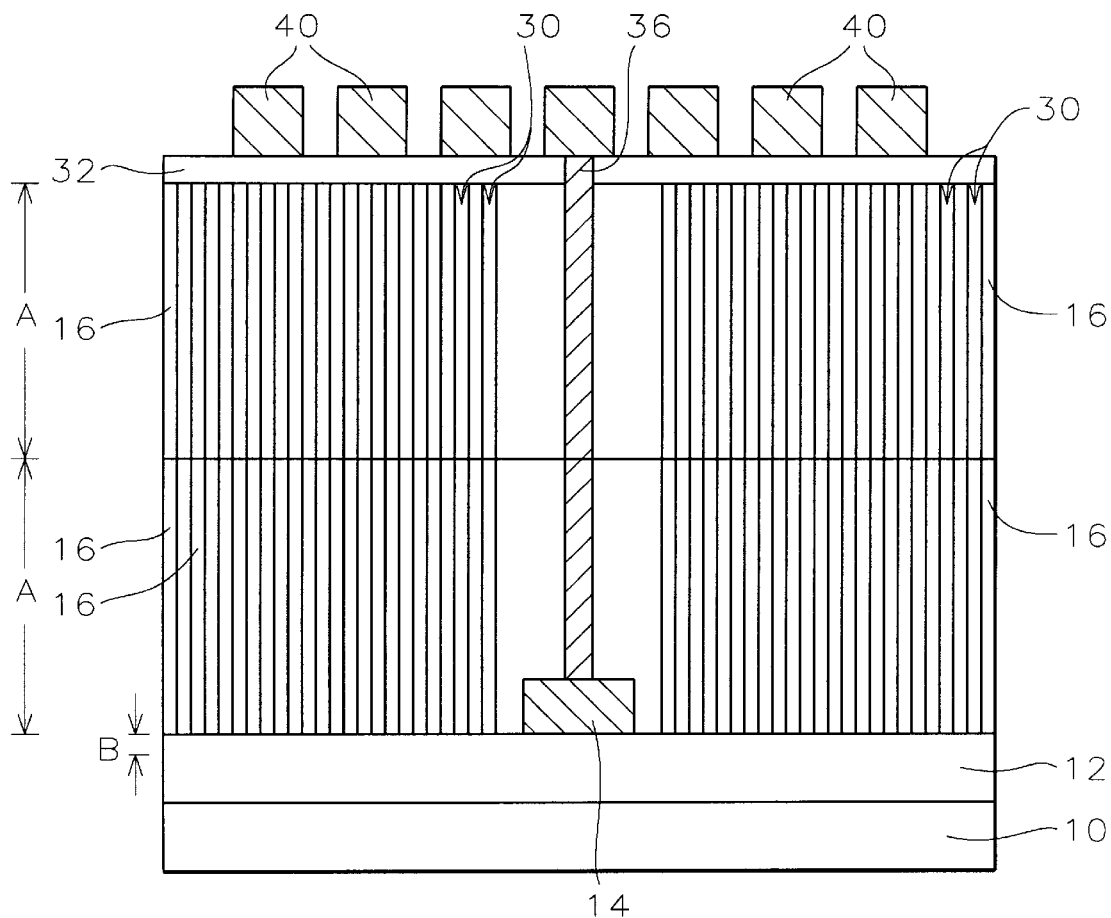

The process of the present invention provides a method for forming air gaps underlying an inductor. It is preferred that the oxide layer containing the air gaps have a thickness of between about 0.6 and 4.0 microns. This will result in a quality factor of the inductor of 3.7 to 7.0 for a frequency of 1 to 3 GHz. Air gaps with a depth of about 4.0 microns can be achieved by stacking two layers of intermetal dielectric 16 patterned with air gaps 30 on top of each other, as shown in FIG. 7. The process can be repeated to achieve even deeper air gaps.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an inductor in the fabrication of an integrated circuit comprising:

providing a metal line overlying a dielectric layer on a semiconductor substrate;

depositing an intermetal dielectric layer overlying said metal line and said dielectric layer;

patterning said intermetal dielectric layer whereby a plurality of openings are made through said intermetal dielectric layer to said dielectric layer;

thereafter depositing an oxide layer overlying said intermetal dielectric layer and capping said plurality of openings thereby forming air gaps within said intermetal dielectric layer;

forming a metal plug through said oxide layer and said intermetal dielectric layer to said metal line; and depositing a metal layer overlying said oxide layer and patterning said metal layer to form a spiral-shaped inductor wherein a portion of said inductor contacts said metal line through said metal plug to complete formation of said inductor in the fabrication of said integrated circuit.

2. The method according to claim 1 wherein said metal line comprises aluminum copper having an underlying titanium nitride barrier layer and an overlying titanium nitride anti-reflective coating layer having a combined thickness of between about 5400 and 6600 Angstroms.

3. The method according to claim 1 wherein said air gaps each have a depth of between about 6000 and 40,000 Angstroms.

4. The method according to claim 1 wherein said air gaps each have a width of between about 0.40 and 0.52 microns.

5. The method according to claim 1 wherein said intermetal dielectric layer comprises tetraethoxysilane (TEOS) oxide having a thickness of between about 16,500 and 19,500 Angstroms.

6. The method according to claim 1 wherein said steps of depositing said intermetal dielectric layer and patterning said intermetal dielectric layer to form openings are repeated whereby said openings have a depth equal to the combined thickness of said intermetal dielectric layers.

7. The method according to claim 1 wherein said oxide layer is deposited to a thickness of between about 1000 and 1500 Angstroms.

8. The method according to claim 1 wherein said metal plug comprises tungsten.

9. The method according to claim 1 wherein said metal layer comprises aluminum copper having an underlying titanium nitride barrier layer and an overlying titanium nitride anti-reflective coating layer having a combined thickness of between about 8100 and 9900 Angstroms.

10. A method of fabricating an inductor in the fabrication of an integrated circuit comprising:

providing a metal line overlying a dielectric layer on a semiconductor substrate;

depositing an intermetal dielectric layer overlying said metal line and said semiconductor substrate;

patterning said intermetal dielectric layer whereby a plurality of openings are made through said intermetal dielectric layer to said dielectric layer;

thereafter depositing an oxide layer overlying said intermetal dielectric layer and capping said plurality of openings thereby forming air gaps within said intermetal dielectric layer;

forming a tungsten plug through said oxide layer and said intermetal dielectric layer to said metal line; and depositing a metal layer overlying said oxide layer and patterning said metal layer to form a spiral-shaped inductor wherein a portion of said inductor contacts said metal line through said tungsten plug to complete formation of said inductor in the fabrication of said integrated circuit.

11. The method according to claim 10 wherein said metal line has a thickness of between about 5400 and 6600 Angstroms.

12. The method according to claim 10 wherein said air gaps each have a depth of between about 0.6 and 40.0 microns and a width of between about 0.4 and 0.52 microns.

13. The method according to claim 10 wherein said intermetal dielectric layer comprises tetraethoxysilane (TEOS) oxide having a thickness of between about 16,500 and 19,500 Angstroms.

14. The method according to claim 10 wherein said steps of depositing said intermetal dielectric layer and patterning said intermetal dielectric layer to form openings are repeated whereby said openings have a depth equal to the combined thickness of said intermetal dielectric layers.

15. The method according to claim 10 wherein said oxide layer is deposited to a thickness of between about 1000 and 1500 Angstroms.

16. The method according to claim 1 wherein said metal layer is deposited to a thickness of between about 8100 and 9900 Angstroms.

17. A method of fabricating an inductor in the fabrication of an integrated circuit comprising:

providing a metal line overlying a dielectric layer on a semiconductor substrate;

depositing an intermetal dielectric layer overlying said metal line and said dielectric layer;

patterning said intermetal dielectric layer whereby a plurality of openings are made through said intermetal dielectric layer to said dielectric layer;

thereafter repeating said steps of depositing said intermetal dielectric layer and patterning said intermetal dielectric layer to form openings until said openings have a depth of between 0.6 and 40.0 microns;

thereafter depositing an oxide layer overlying said intermetal dielectric layer and capping said plurality of openings thereby forming air gaps within said intermetal dielectric layer wherein said air gaps each have a width of 0.40 to 0.52 microns and a depth of 0.6 to 40.0 microns;

forming a tungsten plug through said oxide layer and said intermetal dielectric layer to said metal line; and depositing a metal layer overlying said oxide layer and patterning said metal layer to form a spiral-shaped inductor wherein a portion of said inductor contacts said metal line through said tungsten plug to complete formation of said inductor in the fabrication of said integrated circuit.

18. The method according to claim 17 wherein said intermetal dielectric layer comprises tetraethoxysilane (TEOS) oxide having a thickness of between about 16,500 and 19,500 Angstroms.

19. The method according to claim 17 wherein said oxide layer is deposited to a thickness of between about 1000 and 1500 Angstroms.

* * * * *